(12) United States Patent
Belmont

(10) Patent No.: US 6,929,889 B2
(45) Date of Patent: Aug. 16, 2005

(54) MODIFIED PIGMENT PRODUCTS, DISPERSIONS THEREOF, AND COMPOSITIONS COMPRISING THE SAME

(75) Inventor: James A. Belmont, Action, MA (US)

(73) Assignee: Cabot Corporation, Boston, MA (US)

( * ) Notice: Subject to any disclaimer, the term of this patent is extended or adjusted under 35 U.S.C. 154(b) by 215 days.

(21) Appl. No.: 09/896,880

(22) Filed: Jun. 29, 2001

(65) Prior Publication Data

US 2002/0011185 A1 Jan. 31, 2002

Related U.S. Application Data

(60) Provisional application No. 60/216,090, filed on Jul. 6, 2000.

(51) Int. Cl.[7] .............................................. G09B 67/50
(52) U.S. Cl. ...................... 430/7; 430/108.1; 430/200; 430/270.1; 430/273.1; 430/276.1; 430/278.1; 430/286.1; 430/293; 430/300; 430/306; 430/945
(58) Field of Search .................. 430/7, 108.1, 200, 430/270.1, 273.1, 276.1, 278.1, 286.1, 293, 300, 306, 945; 106/31.6, 31.85, 31.9, 499, 506; 347/100; 359/296

(56) References Cited

U.S. PATENT DOCUMENTS

| | | | |
|---|---|---|---|
| 2,867,540 A | 1/1959 | Harris | 106/307 |
| 3,335,020 A | 8/1967 | Aboytes et al. | 106/307 |
| 3,479,300 A | 11/1969 | Rivin et al. | 252/430 |
| 4,014,844 A | 3/1977 | Vidal et al. | 260/31.2 |
| 4,909,852 A | 3/1990 | Atkinson | 106/448 |
| 4,946,509 A | 8/1990 | Schwartz et al. | 106/496 |
| 5,200,164 A | 4/1993 | Medalia et al. | 423/265 |
| 5,281,261 A | 1/1994 | Lin et al. | 106/20 R |
| 5,418,277 A | 5/1995 | Ma et al. | 524/520 |
| 5,545,504 A | 8/1996 | Keoshkerian et al. | 430/137 |
| 5,554,739 A | 9/1996 | Belmont | 534/885 |
| 5,571,311 A | 11/1996 | Belmont et al. | 106/20 |
| 5,630,868 A | 5/1997 | Belmont et al. | 106/31.75 |
| 5,698,016 A | 12/1997 | Adams et al. | 106/316 |
| 5,707,432 A | 1/1998 | Adams et al. | 106/31.6 |
| 5,713,988 A | 2/1998 | Belmont et al. | 106/31.6 |
| 5,714,993 A | 2/1998 | Keoshkerian et al. | 347/95 |
| 5,716,435 A | 2/1998 | Aida et al. | 106/31.85 |
| 5,749,950 A | 5/1998 | Mahmud et al. | 106/316 |
| 5,766,268 A | 6/1998 | Bruhnke | 8/647 |
| 5,837,045 A | 11/1998 | Johnson et al. | 106/31.85 |
| 5,851,280 A | 12/1998 | Belmont et al. | 106/472 |
| 5,885,335 A | 3/1999 | Adams et al. | 106/316 |
| 5,895,522 A | 4/1999 | Belmont et al. | 106/31.6 |
| 5,914,806 A | 6/1999 | Gordon II et al. | 359/296 |
| 5,919,846 A | 7/1999 | Batlaw et al. | 524/83 |
| 5,922,118 A | 7/1999 | Johnson et al. | 106/31.6 |
| 5,952,429 A | 9/1999 | Ikeda et al. | 525/326.1 |
| 5,964,935 A | 10/1999 | Chen et al. | 106/401 |
| 5,968,243 A | 10/1999 | Belmont et al. | 106/31.65 |
| 5,976,233 A | 11/1999 | Osumi et al. | 106/31.75 |
| 6,042,643 A | 3/2000 | Belmont et al. | 106/472 |
| 6,068,688 A | 5/2000 | Whitehouse et al. | 106/31.65 |
| 6,110,994 A | 8/2000 | Cooke et al. | 523/215 |
| 6,150,433 A | 11/2000 | Tsang et al. | 523/160 |
| 6,221,932 B1 | 4/2001 | Moffatt et al. | 523/160 |
| 6,235,829 B1 | 5/2001 | Kwan | 524/495 |
| 6,336,965 B1 | 1/2002 | Johnson et al. | 106/31.6 |
| 6,350,519 B1 | 2/2002 | Devonport | 428/403 |
| 6,368,239 B1 | 4/2002 | Devonport | 473/449.2 |
| 6,372,820 B1 | 4/2002 | Devonport | 523/215 |
| 6,432,194 B2 | 8/2002 | Johnson et al. | 106/499 |
| 6,458,458 B1 | 10/2002 | Cooke et al. | 428/407 |
| 6,472,471 B2 | 10/2002 | Cooke et al. | 525/165 |
| 6,479,571 B1 | 11/2002 | Cooke et al. | 523/215 |

FOREIGN PATENT DOCUMENTS

| | | | |
|---|---|---|---|
| GB | 910310 | 11/1962 | |
| JP | 53-094581 | 8/1978 | ............ C09C/3/10 |
| JP | 01-113472 | 5/1989 | ............ C09D/7/12 |
| JP | 6-128517 | 5/1994 | ............ C09D/11/02 |
| WO | WO 96/18688 | 6/1996 | ............ C09C/1/56 |
| WO | WO 96/18695 | 6/1996 | ............ C09D/11/00 |
| WO | WO 97/47697 | 12/1997 | ............ C09D/11/00 |
| WO | WO 97/48769 | 12/1997 | ............ C09B/67/22 |
| WO | WO 99/04974 | 2/1999 | ............ B41C/1/10 |
| WO | WO 99/19143 | 4/1999 | ............ B41C/1/10 |
| WO | WO 99/19144 | 4/1999 | ............ B41C/1/10 |
| WO | WO 99/23174 | 5/1999 | ............ C09C/1/56 |
| WO | WO 99/37481 | 7/1999 | ............ B41C/1/10 |
| WO | WO 99/37482 | 7/1999 | ............ B41C/1/10 |
| WO | WO 99/51690 | 10/1999 | ............ C09B/69/00 |
| WO | WO 00/05313 | 2/2000 | ............ C09C/3/10 |
| WO | WO 00/16987 | 3/2000 | ............ B41M/5/36 |
| WO | WO 00/43446 | 7/2000 | ............ C08K/9/06 |
| WO | WO 00/52102 | 9/2000 | ............ C09B/67/00 |
| WO | WO 01/25340 | 4/2001 | ............ C09B/67/20 |

OTHER PUBLICATIONS

International Search Report for PCT/US01/20793, mailed Jan. 9, 2002.
Derwent Abstract No. 82–28019E (Oct. 17, 1979), "Penetrate Flexographic Print Ink Based Polyacrylic Resin Modified Maleińised Rosin Modified Carbon Black".
JP90–0134478 to Mitsubishi Kasei Corp, Publication Date Jan. 31, 1992 Abstract Only (from Derwent).
JP96–0105108 to Mitsubishi Chem Corp, Publication Date Nov. 11, 1997 Abstract Only (from Derwent).
"Effect of Hydrogen Acceptors on pKa of Phenol Resins: Links to Dissolution Inhibition," *Macromolecules*, 1998, vol. 31, pp. 7723–7727.

*Primary Examiner*—John A McPherson

(57) ABSTRACT

The present invention relates to modified pigment products comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms. The use of these modified pigment products in non-aqueous dispersion compositions and in several applications, including printing plates, electrophoretic displays, liquid crystal displays, and ink, coating, toner, and polymer compositions is also disclosed.

61 Claims, No Drawings

MODIFIED PIGMENT PRODUCTS, DISPERSIONS THEREOF, AND COMPOSITIONS COMPRISING THE SAME

This application claims priority to U.S. Provisional Patent Application Ser. No. 60/216,090, filed on Jul. 6, 2000.

BACKGROUND OF THE INVENTION

1. Field of the Invention

The present invention relates to modified pigment products, dispersion compositions of these modified pigment products, and the use of these modified pigment products in several applications, including electrophoretic displays, inks, coatings, and plastics. The present invention also relates to printing plates comprising a substrate and a radiation-absorptive layer, wherein the radiation absorptive layer comprises at least one modified pigment product.

2. Description of the Related Art

Pigments have been used in a variety of applications, such as in inks, coatings, toners, plastics, rubber, films, displays, and the like. Common goals in each of these applications are to provide a pigment which is capable of being substantially and uniformly dispersed, and capable of remaining dispersed in the composition so that color and other properties exhibited by the pigment are uniform throughout the composition or material which incorporates the pigment.

The improvement in the dispersibility and dispersion stability of pigments has been attempted previously and has included coating or adsorbing various surfactants onto the pigment. However, merely adsorbing or coating pigments has potentially several disadvantages. First, the amount of adsorbed surfactant on the pigment is dependent on the properties of the surrounding materials, such as the solvent for an ink. In such a situation, the surfactant may exist in an equilibrium between the surface of the pigment and the solvent. Solubility issues involving the surfactant and the solvent may also come into effect. Other considerations which can effect adsorbed surfactants are the concentration of the pigment, the type of surfactants used, and the temperature and pH of the composition or material containing the pigment. Any one or more of these properties can cause the removal of the surfactant from the surface of the pigment and create additional surfactant in the bulk liquid or medium. This, in turn, may negatively effect the dispersion stability and other properties of the bulk liquid such as foaming, surface tension, viscosity, film strength, film elasticity, and the like. In addition, the excess surfactant which may be found in conventional pigments may also be detrimental to plastic or film-forming properties, such as color, strength, elongation, elasticity, and the like.

One example of the use of adsorbing or coating a material onto a pigment is discussed in U.S. Pat. No. 5,200,164. This discloses the use of a compound containing at least one long chain alkenyl or alkyl group and at least one amine group as a treating agent to improve the dispersion characteristics of carbon black. While improved dispersibility does result, the treating agent used is not attached to the pigment and therefore the issues discussed above apply.

Thus, there is a desire in the art to improve the dispersibility and dispersion stability of pigments with respect to overcoming one or more of the above-described disadvantages. One approach to improving the dispersibility of pigments has been to attach at least one organic group to the pigment. The preparation of these types of pigments has been described in, for example, U.S. Pat. Nos. 5,851,280, 5,554,739, 6,042,643, and 5,837,045, as well as PCT Publication WO99/23174, all of which are incorporated in their entirety herein by reference. The organic group can be chosen in order to obtain stable dispersions in a variety of media. Aqueous and non-aqueous compositions comprising these modified pigments have also been described in U.S. Pat. Nos. 5,571,311, 5,713,988, 5,672,198, and 5,707,432, as well as PCT Publication WO99/51690, all of which are incorporated in their entirety herein by reference. While this approach does improve the dispersibility of pigments, there exists a need to obtain pigments which are dispersible in specific media, such as hydrocarbon solvents.

Pigment dispersibility is important when the pigment is used as the photothermal conversion material in a printing plate. Printing plates are used in several areas of image reproduction, including lithographic printing (also known as offset or planographic printing), flexographic printing, and gravure printing (also called intaglio or rotogravure). In general, the printing process involves the development of an image on the plate followed by exposure to an ink.

Lithographic printing plates are among the most widely used for making printed copies. Generally, an infrared or near-infrared laser-imageable lithographic printing plate includes at least the following layers: a grained-metal or polyester plate or sheet-like substrate and a radiation-absorptive layer coated thereon. Protective layers for the substrate or the surface of the coated plate may also be used which. When coated onto the substrate, this protective layer can also serve as an adhesion-promoting primer. Other layers may be used, for example, to improve adhesion between layers and durability of the printing plate.

In general, the radiation-absorptive layer comprises a photothermal conversion material capable of interacting with the imaging radiation and a polymeric resin or binder. In the imaging process, regions of the plate are selectively exposed to a laser output or other heat source capable of removing or chemically modifying the radiation-absorbent layer. Typically, heat sensitive lithographic printing plates are exposed to radiation having wavelengths of between 800 and 1200 nm. The laser output will define a pattern on the printing plate and either remove or chemically or physically modify only those regions of the radiation-absorptive layer which define the pattern. Afterwards, the printing plate can be further developed by subjecting it to a solvent capable of removing the exposed region(s), if any remains, which define the pattern or, if desired, the plate can be developed such that the non-exposed region(s) are removed. The details of the various conventional components and techniques for such printing plates are described in U.S. Pat. No. 5,493,971; U.S. Pat. No. 5,705,308; EP 0 803 771 A1; EP 0 770 494 A2; EP 0 770495 A1; as well as PCT Publications WO96/20429 and WO-98/31550 and the patents set forth therein, all of which are incorporated in their entirety by reference herein.

Several types of polymers have been used in the radiation-absorptive layer. Representative polymers include polyurethanes, poly(vinyl alcohol), polyacrylates, polystyrene, styrene-acrylate polymers, metal oxide polymers, epoxy resins, and phenolic polymers.

The photothermal conversion material can be either a pigment or a dye. For example, UV- and IR-active dyes have been disclosed in phenolic printing plate applications (see DBP 879205 and WO 97/39894). IR-absorptive pigments such as carbon black have also been shown to be useful in a lithographic printing plate (see, for example, WO 99/08157, WO 96/20429, WO 99/11458, and U.S. Pat. No. 6060218 in which carbon black is present in a phenolic polymer).

Pigments such as carbon black are broad band radiation absorbers and, as such, offer an improvement in performance over dyes. However, the effectiveness of pigments such as carbon black as a photothermal conversion material in a printing plate is dependent on the dispersibility of the pigment in the polymer. Thus, there is a need for printing plates comprising pigments such as carbon black with improved dispersibility in phenolic polymers used to produce printing plates.

Carbon blacks that have been modified to have carboxylate or sulfonate functionalities have also been disclosed in lithographic printing plates. For example, see WO 99/04974, WO 99/19143, WO 99/19144, WO 99/37482, and WO 99/37481. However, none of these disclose the use of modified carbon blacks comprising non-ionic groups in a printing plate application.

PCT Publication WO99/51690 discloses printing plates comprising at least one modified pigment product. These modified pigments comprise a pigment having attached at least one type of polymeric functionality. While such modified pigments offer improvements over the prior art, there remains a need for modified pigment products that provide good dispersibility and imaging performance in printing plate applications, as well as in applications including electrophoretic displays, inks, coatings, and plastics.

SUMMARY OF THE INVENTION

The present invention relates to a modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms.

The present invention further relates to dispersion compositions comprising a non-aqueous solvent, preferably a hydrocarbon solvent, and at least one modified pigment product comprising a pigment having attached at least one organic group represented by the formula —X-Sp-Alk.

The present invention further relates to the use of the modified pigment products of this invention in electrophoretic displays, inks, inkjet inks, coatings, plastics, and toners.

The present invention further relates to printing plates comprising a substrate and a radiation-absorptive layer, wherein the radiation-absorptive layer comprises a polymer and at least one pigment product comprising a pigment having attached at least one organic group represented by the formula —X-Sp-Alk.

The present invention further relates to a method of imaging the printing plates of this invention.

The present invention further relates to a lithographic or flexographic printing plate, a thermal transfer recording material, a proofing material, and a black matrix comprising the modified pigment products of this invention.

It is to be understood that both the foregoing general description and the following detailed description are exemplary and explanatory only and are intended to provide further explanation of the present invention, as claimed.

DETAILED DESCRIPTION OF THE INVENTION

The present invention relates, in general, to modified pigment products, dispersion compositions comprising said modified pigment products, and printing plates comprising a substrate and a radiation-absorptive layer comprising said modified pigment products. The use of the modified pigment products compositions in various applications is also described.

The modified pigment products of the present invention comprise a pigment having attached at least one organic group represented by the formula —X-Sp-Alk. The pigment products of the present invention are modified such that these organic groups are attached to the pigment, which provides a more stable attachment of the groups onto the pigment compared to adsorbed groups, e.g., polymers, surfactants and the like.

The group X represents an arylene, heteroarylene, or alkylene group. X is directly attached to the pigment. The arylene or heteroarylene group can be further substituted with any group, such as one or more alkyl groups or aryl groups. Preferably, the arylene group is phenylene, naphthylene, or biphenylene. When X represents an alkylene group, examples include, but are not limited to, substituted or unsubstituted alkylene groups which may be branched or unbranched. The alkylene group can be substituted with one or more groups, such as aromatic groups. Preferred examples include, but are not limited to, $C_1$–$C_{12}$ groups like methylene, ethylene, propylene, and butylene groups. Preferably, X is an arylene group.

The group X may be substituted with one or more functional groups. Examples of functional groups include, but are not limited to, R', OR', COR', COOR', OCOR', carboxylates, halogens, CN, NR'$_2$, SO$_3$H, sulfonates, —OSO$_3$, NR'(COR'), CONR'$_2$, NO$_2$, PO$_3$H$_2$, phosphonates, phosphates, N=NR', SOR', NSO$_2$R', wherein R' which can be the same or different, is independently hydrogen, branched or unbranched $C_1$–$C_{20}$ substituted or unsubstituted, saturated or unsaturated hydrocarbons, e.g., alkyl, alkenyl, alkynyl, substituted or unsubstituted aryl, substituted or unsubstituted heteroaryl, substituted or unsubstituted alkaryl, or substituted or unsubstituted aralkyl.

The group Alk represents an alkenyl or alkyl group containing 50–200 carbon atoms. Preferably, the alkenyl or alkyl group contains 60–100 carbons. Several types of alkenyl or alkyl groups are useful for the modified pigment products of the present invention. Preferably, the alkenyl or alkyl groups are polymers of butene containing 50–200 carbon atoms and, more preferably 60–100 carbons. Examples of preferred alkenyl or alkyl groups include, but are not limited to, polymers or oligomers of isobutene, butene, or propene.

The group Sp represents a spacer group. Spacer group, as used herein, is a link between two groups and can be a bond or a chemical group. Examples of chemical groups include, but are not limited to, —CO$_2$—, —O$_2$C—, —CO—, —OSO$_2$—, —SO$_3$—, —SO$_2$—, —SO$_2$C$_2$H$_4$O—, —SO$_2$C$_2$H$_4$S—, —SO$_2$C$_2$H$_4$NR—, —O—, —S—, —NR—, —NRCO—, —CONR—, —NRCO$_2$—, —O$_2$CNR—, —NRCONR—, —NRCOCH(CH$_2$CO$_2$R)—, —NRCOCH$_2$CH(CO$_2$R)—, —N(COR)(CO)—, arylene groups, alkylene groups, succinimidyl groups having the formula:

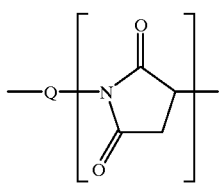

and the like. Q represents a bond or a —SO$_2$C$_2$H$_4$(NR'Alkylene)$_p$— group, wherein the group Alkylene is a linear or branched C$_1$–C$_{12}$ alkylene group, R' is independently hydrogen, a C$_1$–C$_6$ alkyl group, or an (AlkyleneNR),R group, and p is an integer from 0–10. R, which can be the same or different, represents hydrogen or a substituted or unsubstituted aryl or alkyl group. Preferably, the group Sp is a succinimidyl group having the formula shown above, and the group Alk is a polymer or oligomer of isobutylene. Thus, the group represented by the formula —X-Sp-Alk is most preferably a polyisobutenylsuccinimidylphenyl group. An additional preferred group Sp is a succinimidyl group having the formula shown above, wherein Q is a —SO$_2$C$_2$H$_4$(NR'C$_2$H$_4$)$_p$— group, R' is independently hydrogen or a (C$_2$H$_4$NH)$_p$H group, and p is an integer from 1–10. Groups of this latter type can be prepared, for example, from polyethyleneiminesuccinimide derivatives such as the OLOA chemical additives (for example, OLOA-1200), commercially available from Chevron.

The organic group can be attached to the pigment in varying amounts, i.e., low or high amounts. The amount to be attached can be varied in order to obtain the desired performance attributes, for example, dispersibility in a hydrocarbon solvent and/or dispersibility in a polymeric resin or binder. In addition, modified pigment products can comprise multiple attached organic groups, which can result in improved properties. The level of treatment of the various groups attached on the pigment can be any amount and preferably is from about 0.01 to about 5.0 micromoles/m$^2$, and more preferably is from about 0.1 to about 3.0 micromoles/m$^2$. Preferred products arise when the treating agent is used at levels greater than 5 micromoles/m$^2$, recognizing that not all of the treating agent results in attached groups.

Several pigment types are useful in the present invention. The pigments to be modified can be, but are not limited to, pigments traditionally used in ink compositions (including inkjet ink compositions), coating compositions (including paint formulations), liquid and solid toners, displays (including electrophoretic displays), films, plastics, rubbers, and the like. Examples include, but are not limited to, black pigments (e.g., carbon products such as carbon black) and other colored pigments (e.g., polymeric and organic pigments).

Examples of suitable carbon products include, but are not limited to, graphite, carbon black, vitreous carbon, carbon fibers, activated charcoal, and activated carbon. The carbon may be of the crystalline or amorphous type. Finely divided forms of the above are preferred; also, it is possible to utilize mixtures of different carbons. Any surface area can be used. Of the carbon products, carbon black is most preferred.

The pigments to be modified may be chosen from a wide range of conventional colored pigments. Preferably, the pigment is a white pigment, a black pigment, a blue pigment, a brown pigment, a cyan pigment, a green pigment, a violet pigment, a magenta pigment, a red pigment, or a yellow pigment, or shades or combinations thereof. Suitable classes of colored pigments include, for example, anthraquinones, phthalocyanine blues, phthalocyanine greens, diazos, monoazos, pyranthrones, perylenes, heterocyclic yellows, quinacridones, and (thio)indigoids. Representative examples of phthalocyanine blues include copper phthalocyanine blue and derivatives thereof (Pigment Blue 15). Representative examples of quinacridones include Pigment Orange 48, Pigment Orange 49, Pigment Red 122, Pigment Red 192, Pigment Red 202, Pigment Red 206, Pigment Red 207, Pigment Red 209, Pigment Violet 19 and Pigment Violet 42. Representative examples of anthraquinones include Pigment Red 43, Pigment Red 194 (Perinone Red), Pigment Red 216 (Brominated Pyanthrone Red) and Pigment Red 226 (Pyranthrone Red). Representative examples of perylenes include Pigment Red 123 (Vermillion), Pigment Red 149 (Scarlet), Pigment Red 179 (Maroon), Pigment Red 190 (Red), Pigment Violet, Pigment Red 189 (Yellow Shade Red) and Pigment Red 224. Representative examples of thioindigoids include Pigment Red 86, Pigment Red 87, Pigment Red 88, Pigment Red 181, Pigment Red 198, Pigment Violet 36, and Pigment Violet 38. Representative examples of heterocyclic yellows include Pigment Yellow 1, Pigment Yellow 3, Pigment Yellow 12, Pigment Yellow 13, Pigment Yellow 14, Pigment Yellow 17, Pigment Yellow 65, Pigment Yellow 73, Pigment Yellow 74, Pigment Yellow, Pigment Yellow 117, Pigment Yellow 128 and Pigment Yellow 138. Such pigments are commercially available in either powder or press cake form from a number of sources including, BASF Corporation, Engelhard Corporation and Sun Chemical Corporation. Examples of other suitable colored pigments are described in the *Colour Index*, 3rd edition (The Society of Dyers and Colourists, 1982). Representative examples of black pigments include various carbon blacks (Pigment Black 7) such as channel blacks, furnace blacks and lamp blacks, and include, for example, carbon blacks sold under the Regal®, Black Pearls®, Elftex®, Monarch®, Mogul®, and Vulcan® trademarks available from Cabot Corporation (such as Black Pearls® 2000, Black Pearls® 1400, Black Pearls® 1300, Black Pearls® 1100, Black Pearls® 1000, Black Pearls® 900, Black Pearls® 880, Black Pearls® 800, Black Pearls® 700, Black Pearls® L, Elftex ® 8, Monarch® 1400, Monarch® 1300, Monarch® 1100, Monarch® 1000, Monarch® 900, Monarch® 880, Monarch® 800, Monarch® 700, Mogul® L, Regal® 330, Regal® 400 Vulcan(® P). Other suitable carbon blacks include, but are not limited to, Printex 40, Printex 80, Printex 300, Printex L, Printex U, Printex V, Special Black 4, Special Black 5, FW200, (the foregoing available from Degussa Corporation), Raven 780, Raven 890, Raven 1020, Raven 1040, Raven 1255, Raven 1500, Raven 5000, Raven 5250 (the foregoing available from Columbian Chemical Corporation) and MA100 and MA440 available from Mitsubishi Chemical Corporation. The colored pigment will typically have a wide range of BET surface areas, as measured by nitrogen adsorption. Preferably, the colored pigment has a surface area equal or greater than 10 m$^2$/g, and more preferably equal or greater than and 100 m$^2$/g, thereby corresponding to a smaller primary/aggregate particle size. Such surface areas have been found to provide for a more uniform distribution and efficient level of treating agent on the surface of the pigment and a higher percent yield of the surface-modified colored pigment after post processing techniques. If the preferred higher surface area of the colored pigment (thereby corresponding to a smaller particle size) is not readily available, it is well recognized by those skilled in the art that the colored pigment may be subject to conventional size comminution or reduction techniques, such as ball or jet milling, to reduce the pigment to the desired particle size.

The modified pigment products of the present invention are modified using methods known to those skilled in the art such that chemical groups are attached to the pigment. For example, the modified pigment products of the present invention can be prepared using the methods described in U.S. Pat. Nos. 5,554,739, 5,851,280, 6,042,643, 5,707,432, and 5,837,045, the descriptions of which are fully incorporated herein by reference.

The pigment products may be purified by washing, such as by filtration, centrifugation, or a combination of the two methods, to remove unreacted raw materials, byproduct salts and other reaction impurities. The products may also be isolated, for example, by evaporation or it may be recovered by filtration and drying using known techniques to those skilled in the art. Dispersions of the pigments of the present invention may be further purified or classified to remove impurities and other undesirable free species which can co-exist in the dispersion as a result of the manufacturing process. For example, the pigment dispersions can be subjected to a classification step, such as centrifugation, to substantially remove particles having a size above about 1.0 micron, preferably above about 0.5 micron. In addition, the Idisperson is preferably purified to remove any undesired free species, such as unreacted treating agent. Known techniques of ultrafiltration/diafiltration using a membrane or ion exchange may be used to purify the dispersion and remove a substantial amount of free and unwanted species. Such additional classification and purification methods are more fully described in PCT Publication No. WO 99/38921, published Aug. 5, 1999, the disclosure of which is fully incorporated herein by reference.

In one embodiment, the modified pigment products of the present invention can be incorporated into a non-aqueous dispersion composition. Thus, the invention provides an improved dispersion composition comprising an organic solvent and at least one modified pigment product having attached at least one organic group comprising a group represent by the formula —X-Sp-Alk. Preferably, the amount of modified pigment is between about 0.1% to about 40.0%, most preferably between about 5.0% to about 20.0%. Other additives may also be included, such as surfactants and chemical stabilizers.

Examples of non-aqueous solvents that can be used for the dispersion composition of the present invention include linear or branched aliphatic hydrocarbons such as hexane and isooctane, blends of aliphatic hydrocarbons such as Norpar® and Isopar® solvents from Exxon, aromatic hydrocarbons such as toluene, benzene, and xylene, alcohols, polyols, ketones, esters, and the like. Mixtures of these solvents can also be used. Preferably the solvent is an aliphatic or aromatic hydrocarbon.

The dispersion compositions can be prepared by any method known to one skilled in the art. For example, the modified pigment product may be added into the solvent as either a predispersion or as a solid. Use of the modified pigment products having attached at least one organic group comprising a group represented by the formula —X-Sp-Alk provide substantial advantages. These modified pigment products have improved dispersibility in the solvent, thus reducing or eliminating such steps as milling and the like. Also, the solvent of the dispersion composition may be used or added during the preparation of the modified pigment product, thus eliminating the need for a separate dispersion step. The dispersions may have improved stability compared to traditional dispersions.

In another embodiment, the modified pigment products of the present invention can be used in printing plate applications. Printing plates, in general, include both a substrate and a radiation-absorptive layer. Other layers may also be included. In the imaging process, selected regions of the plate are exposed to radiation that is capable of either removing a portion of the radiation-absorptive layer or physically or chemically modifying this layer so that it can interact differently with a developing agent than the unexposed regions. In this way, hydrophilic (or ink-repelling) regions and hydrophobic (or ink-loving) regions are produced.

Several types are substrates are useful for the printing plates of the present invention and are known to those skilled in the art. Preferred substrates include paper, hydrophilic metals such as aluminum, particularly anodized or grained anodized aluminum, as well as hydrophilic polymers such as polyesters, and, in particular, polyethylene terephthalate. However, other types of substrates can also be used.

In general, a radiation-absorptive layer comprises a photothermal conversion material and a polymer or resin. Both dyes and pigments have been used as a photothermal conversion material. The radiation-absorptive layer of the present invention comprises a polymer and at least one modified pigment product comprising a pigment having attached at least one organic group represented by the formula —X-Sp-Alk, as described above.

The amount of pigment used is dependent on the desired performance of the radiation-absorptive layer. Preferably, the pigment is present in an amount ranging from about 1.0% to about 50.0%, and more preferably from about 10.0% to about 40.0%.

The printing plates of the present invention comprise a radiation-absorptive layer optionally comprising a polymeric resin or binder. The polymer is chosen to provide the plate with desirable physical and chemical properties such as flexibility, hardness, and ink compatibility. Several different polymeric systems can be used in the printing plates of the present invention. Examples include, but are not limited to, polyurethanes, vinyl alcohol-containing polymers such as poly(vinyl alcohol), polyacrylates, polystyrenes, styrene-acrylate polymers, metal oxide polymers, epoxy resins, and phenolic polymers. Various comonomers can be included into these polymers to further adjust the final properties of the polymeric resin. A preferred class of polymeric resins or binders is styrene-acrylate polymer, styrene-butadiene copolymers, and acrylic polymers.

The polymers described above can be produced by any method known to those skilled in the art, including free radical, anionic, cationic, and condensation polymerizations. Polymer properties such as molecular weight are chosen dependent on the desired physical and chemical properties of the final plate. For example, if the molecular weight is too high, this may effect the ability of the final irradiated plate to be developed, for example, in an alkaline medium in which it is desired to have the irradiated areas dissolve. On the other hand, if the molecular weight is too low, the plate may become tacky and difficult to handle.

The printing plates of the present invention can be prepared using any method known to those skilled in the art. The modified pigment products described above can be incorporated into these polymeric resins or binders using any standard blending technique, including, for example, solvent casting. The modified pigment products can be incorporated either as predispersions in a solvent (aqueous or non-aqueous) as well as in a dried or partially dried powdered state.

In a typical plate forming process, a dispersion of the pigment in an organic solvent is combined with a dispersion or solution of the polymeric resin and cast as a film on the substrate. The better the dispersibility of the pigment in the solvent and in the polymeric resin, the better the plate performance. A particular advantage of the modified pigment products of the present invention is that they provide the desired improved dispersibility in solvents used in a typical plate forming process, for example, hydrocarbon solvents, as well as in the polymeric resin.

The present invention also relates to a method of imaging a printing plate comprising a radiation-absorptive layer which comprises a modified pigment product and optionally a polymer which involves selectively exposing the plate to a laser output in a pattern representing an image. The irradiation is done to selectively remove, for example by ablation, or chemically modify at least a portion of the radiation-absorptive layer that defines the pattern. This method may further involve the development of the irradiated plate using a solvent that is capable of removing portions of the imaged layer(s) defining the pattern.

The present invention relates to lithographic printing plates, such as infrared or near-infrared laser-imageable printing plates. As described above, an infrared or near-infrared laser-imageable lithographic printing plate includes at least the following layers: a grained-metal, polyester or paper plate or sheet-like substrate and a radiation-absorptive layer coated thereon. In the present invention, the radiation-absorptive layer comprises an optional polymeric resin or binder, and at least one modified pigment product comprising a pigment having attached at least one organic group comprising a group represented by the formula —X-Sp-Alk, as described above. Protective layers for the substrate or the surface of the coated plate may also be used in the present invention. When coated onto the substrate, the protective layer can also serve as an adhesion-promoting primer. Other layers may be used, for example, to improve adhesion between layers and durability of the printing plate. The imaging process is as described above.

Also, the present invention relates to flexographic printing plates, such as infrared or near-infrared laser-imageable printing plates. Generally, an infrared or near-infrared laser-imageable flexographic printing plate includes at least the following layers: a polyester plate or sheet-like substrate, a UV curable layer, and a radiation-absorptive layer coated thereon. In the present invention, the radiation-absorptive layer comprises an optional polymeric resin or binder and at least one modified pigment product comprising a pigment having attached at least one organic group comprising a group represented by the formula —X-Sp-Alk, as described above. Protective layers for the substrate or the surface of the coated plate may also be used in the present invention. Other layers may be used, for example, to improve adhesion between layers and durability of the printing plate. In the imaging process, a gravure or flexographic printing plate is selectively exposed to a laser output or other source capable of removing or chemically modifying the radiation-absorbent layer or layers adjacent thereto. The laser output will define a pattern on the printing plate and remove or modify only those portions of the radiation-absorptive layer which define the pattern. The plate may be subsequently exposed to UV energy. Afterwards, the printing plate can be further developed by subjecting it to a solvent capable of removing the nonexposed layer(s), if any remains, which defines the same pattern. The details of the various conventional components and techniques for such printing plates are described in European patent application EP 0928685 A2, which is incorporated in its entirety by reference herein.

The present invention further relates to thermal transfer recording materials. Generally, a thermal transfer recording material includes an ink layer, a photothermal layer, and a support. In the present invention, the photothermal layer comprises an optional polymeric resin or binder and at least one modified pigment product comprising a pigment having attached at least one organic group comprising a group represented by the formula —X-Sp-Alk, as described above. Protective layers for the substrate or the surface of the coated plate may also be used in the present invention. Other layers may be used, for example, to improve adhesion between layers of the recording material or to provide a cushion between layers. In the imaging process, the recording material may be exposed by a laser through the support while the thermal transfer recording material is in contact with a receiving material. The laser output will define a pattern on the recording material and cause an image to be transferred to the receiving material. The details of the various conventional components and techniques for such photothermal recording materials are described in Japanese Patent Application No. JP10016395A, which is incorporated in its entirety by reference herein. These thermal transfer recording materials may also be used for color proofing in printing systems or they may be used in medical diagnostic systems.

The present invention further relates to other types of proofing materials. Generally, these proofing materials include at least the following layers: a radiation transparent support, a radiation curable layer, and a receiving layer. In the present invention, the radiation curable layer comprises an optional polymeric resin or binder and at least one modified pigment product comprising a pigment having attached at least one organic group comprising a group represented by the formula —X-Sp-Alk, as described above. Protective layers for the substrate or the surface of the coated plate may also be used in the present invention. Other layers may be used, for example, to improve durability and adhesion between layers of the printing plate. In the imaging process, the proofing material is selectively exposed, through the support, to a laser output or other source capable of causing the curing of the radiation curable layer. The laser output will define a pattern on the printing plate and cure only those portions of the radiation curable layer which define the pattern. Subsequently, the support is removed. The cured image may adhere to the receiving layer and the uncured portions of the radiation curable layer are removed with the support. The details of the various conventional components and techniques for such printing plates are described in European Patent Application No. EP924568 which is incorporated in its entirety by reference herein.

The present invention further relates to image displays. In one embodiment, the display is a liquid crystal display (LCD). Examples of liquid crystal displays include, for example, super twisted nematic (STN) displays and thin film transistor (TFT) displays. Each of these types of liquid crystal displays contains a black matrix element. A black matrix is generally formed by applying a photosensitive coating on a clear substrate, exposing the coating imagewise, and developing and drying the coating. In the present invention, the photosensitive coating comprises a photosensitive resin, a solvent, and at least one modified pigment product comprising a pigment having attached at least one organic group comprising a group represented by the formula —X-Sp-Alk, as described above. The color filter further comprises colored layers. The color layers may be, for example, red, green and yellow, or cyan, magenta and yellow. The details of the various conventional components and techniques for such black matrices are described in Japanese Patents Nos. JP11062119; JP10300921; JP11006914; JP 11014822; and JP 11142639 which are all incorporated in their entireties by reference herein.

In another embodiment, the present invention relates to an electrophoretic image display. In general, an electrophoretic display contains particles in some arrangement between two electrodes, one being transparent. The particles carry a charge and can therefore respond to changes in the polarity of the electrodes. Thus, the particles will move towards or away from either electrode, depending on the relative charge of the pigment. In this way, an image is formed, which can be viewed through the transparent electrode.

The electrophoretic displays of the present invention comprise an arrangement of microcapsules which contain a dielectric fluid and particles suspended therein. In the present invention, the microcapsules in the electrophoretic display comprise at least one modified pigment product comprising a pigment having attached at least one organic group comprising a group represented by the formula —X-Sp-Alk, as described above. In these displays, the dielectric fluid can be any fluid which is compatible with the modified pigment products. The fluid also has a different color than the modified pigment product, therefore providing a visual contrast. Thus, the microcapsules contain a dispersion of the modified pigment products of the present invention in a dielectric fluid.

The present invention further relates to the use of a modified pigment product in non-aqueous ink and coating compositions. In general, an ink composition comprises a liquid vehicle and a pigment. Coating composition generally comprise a liquid vehicle, a binder, and a pigment. In the ink and coating compositions of the present invention, the pigment is a modified pigment product comprising a pigment having attached at least one organic group comprising a group represented by the formula —X-Sp-Alk, as described above. The solvent in these compositions is a non-aqueous solvent such as, for example, aromatic or aliphatic hydrocarbons, alcohols, ketones, and esters.

In another embodiment, the present invention relates to non-aqueous inkjet ink compositions comprising a vehicle and a modified pigment product comprising a pigment having attached at least on organic group comprising a group represented by the formula —X-Sp-Alk, as described above. The pigment can be any color pigment. The vehicle can be a non-aqueous liquid vehicle. Examples include, but are not limited to, blends of aliphatic hydrocarbons such as Norpar® and Isopar® solvents from Exxon and aromatic hydrocarbons such as toluene and xylene. The vehicle can also be a solid vehicle. Thus, the inkjet ink composition of the present invention can be a solid inkjet ink composition. Examples of a solid vehicle include, but are not limited to, low melting polymeric materials and waxes.

The present invention further relates to the use of a modified pigment product in a polymer composition comprising a polymer and a modified pigment product. The modified pigment product comprises a pigment having attached at least one organic group comprising a group represented by the formula —X-Sp-Alk, as described above. The attached organic group can provide improved compatibility with the polymer of the polymer composition and may, therefore, further impart improved properties to the composition.

The present invention further relates to the use of a modified pigment product in a toner composition. In electrophotography, an image comprising an electrostatic field pattern (the latent image) is formed on an insulative surface of an electrophotographic element. Typically, the image is then visualized or developed by contact with an oppositely charged toner powder. The toned image is then transferred onto a transfer medium such as paper and fixed by heat and/or pressure.

In general, toner compositions comprise a binder resin having a pigment dispersed therein. In the present invention, the pigment is a modified pigment product comprising a pigment having attached at least one organic group comprising a group represented by the formula —X-Sp-Alk, as described above. The toner compositions can be either dry powder (including two component systems composed of dry toner powder and carrier particles) or in liquid form.

The present invention will be further clarified by the following examples, which are intended to be purely exemplary of the present invention.

EXAMPLES

Example 1

Preparation of a Polymer

Maleic anhydride (17 g) and 230 g of a polyisobutylene of MW 1330 (available from Amoco, Chicago, Ill.) were heated with mechanical stirring under nitrogen for 18 hours at 200° C. The reaction mixture was cooled to room temperature, and 18.7 g of p-phenylenediamine was added. The reaction mixture was then heated for 4 hours at 200° C. After cooling, hexanes were added, some solids were removed by centrifugation, and the remaining solution was concentrated under vacuum. The polymer was N-(p-aminophenyl) polyisobutenylsuccinimide.

Example 2

Preparation of a Polymer

Maleic anhydride (9.3 g) and 80 g of a polyisobutylene of MW 940 (available from Amoco, Chicago, Ill.) were heated with mechanical stirring under nitrogen for 18 hours at 200° C. The reaction mixture was cooled to room temperature, and 10.3 g of p-phenylenediamine was added. The reaction mixture was then heated for 3 hours at 200° C. After cooling, hexanes were added, some solids were removed by centrifugation, and the remaining solution was concentrated under vacuum. The polymer was N-(p-aminophenyl) polyisobutenylsuccinimide.

Example 3

Preparation of a Modified Pigment Product

A solution of 1.87 g of $NaNO_2$ in 100 g of water was added dropwise to a stirring mixture of 40.8 g of the polymer of Example 1, 300 mL of hexane, 2.60 g of methanesulfonic acid, and 40 g of carbon black. The carbon black had a surface area of 112 $m^2$/g and a DPBA of 60 mL/100 g. When the addition was complete, the mixture was heated to 70° C. and the stirring was continued for an additional hour. The mixture was cooled and the aqueous layer was removed. The resulting material was a dispersion in hexanes of a modified pigment product, namely a modified carbon product, having attached polyisobutenylsuccinimidylphenyl groups. The product was purified with hexanes in a diafiltration apparatus having a porous carbon membrane.

Example 4

Preparation of a Modified Pigment Product

A solution of 1.60 g of $NaNO_2$ in 50 g of water was added dropwise to a stirring mixture of 26.9 g of the polymer of Example 2, 150 mL of hexane, 2.32 g of methanesulfonic acid, and 20 g of carbon black. The carbon black had a surface area of 200 m$^2$/g and a DPBA of 117 inL/100 g. When the addition was complete, the mixture was heated to 70° C. and the stirring was continued for an additional hour. The mixture was cooled and the aqueous layer was removed. The resulting material was a dispersion in hexanes of a modified pigment product, namely a modified carbon product, having attached polyisobutenylsuccinimidylphenyl groups. The product was purified with hexanes in a diafiltration apparatus having a porous carbon membrane.

As noted above, the modified pigment products of the present invention would be useful in a wide variety of applications and, in particular, non-aqueous dispersion compositions and printing plates. Additional applications include electrophoretic displays, inks, coatings, and plastics.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

We claim:

1. A modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

2. The modified pigment product of claim 1, wherein Alk represents a polymer or oligomer of isobutene, butene, or propene containing 60–100 carbons.

3. The modified pigment product of claim 1, wherein Alk represents a polymer of butene.

4. The modified pigment product of claim 1, wherein X is an arylene group.

5. A non-aqueous coating composition comprising the modified pigment product of claim 1.

6. A polymer composition comprising the modified pigment product of claim 1.

7. A non-aqueous ink composition comprising the modified pigment product of claim 1.

8. A toner composition comprising the modified pigment product of claim 1.

9. A modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

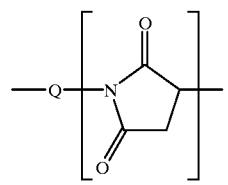

wherein Q represents a bond or a —SO$_2$C$_2$H$_4$(NR' Alkylene)$_p$— group, wherein the group Alkylene is a linear or branched C$_1$–C$_{12}$ alkylene group, R' is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

10. The modified pigment product of claim 9, wherein Q is a —SO$_2$C$_2$H$_4$(NR'C$_2$H$_4$)$_p$— group, R' is independently hydrogen or a (C$_2$H$_4$NH)$_p$H group, and p is an integer from 1–10.

11. The modified pigment product of claim 9, wherein Q is a bond.

12. A modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

13. A dispersion composition comprising a non-aqueous solvent and at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

14. The dispersion composition of claim 13, wherein Alk represents a polymer or oligomer of isobutene, butene, or propene containing 60–100 carbon atoms.

15. The dispersion composition of claim 13, wherein Alk represents a polymer of butene.

16. The dispersion composition of claim 13, wherein the non-aqueous solvent Is an aromatic or an aliphatic hydrocarbon solvent.

17. A dispersion composition comprising a non-aqueous solvent and at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

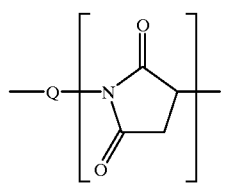

wherein Q represents a bond or a —SO$_2$C$_2$H$_4$(NR' Alkylene)$_p$-group, wherein the group Alkylene is a linear or branched C$_1$–C$_{12}$ alkylene group, R' is independently hydrogen, a C$_1$–C$_6$alkyl group, or an (AlkyleneNR)$_p$R group, and p is an integer from 0–10, and R, which can be the same or different, represents hydrogen or a substituted or unsubstituted aryl or alkyl group.

18. The dispersion composition of claim 17, wherein Q is a —SO$_2$C$_4$(NR'C$_2$H$_4$)$_p$— group, R' is independently hydrogen or a (C$_2$H$_4$NH)$_p$H group, and p is an integer from 1–10.

19. The dispersion composition of claim 17, wherein Q is a bond.

20. A dispersion composition comprising a non-aqueous solvent and at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

21. A printing plate comprising: a) a substrate and b) a radiation-absorptive layer, wherein the radiation-absorptive layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

22. The printing plate of claim 21, wherein the radiation-absorptive layer further comprises a polymer.

23. The printing plate of claim 22, wherein the polymer is selected from the group of styrene-acrylate polymers, styrene-butadiene copolymers, and acrylic polymers.

24. The printing plate of claim 21, wherein Alk represents a polymer of butene.

25. The printing plate of claim 21, wherein Alk represents a polymer or oligomer of isobutene, butene, or propene and maleic anhydride or derivatives thereof.

26. The printing plate of claim 21, wherein the substrate is a hydrophilic metal substrate.

27. The printing plate of claim 21, wherein the substrate is aluminum or polyester.

28. A method of imaging the printing plate of claim 21, comprising selectively exposing the plate to a laser output in a pattern representing an image to selectively remove or chemically modify at least the radiation-absorptive layer defining the pattern.

29. The method of claim 28, further comprising subjecting the plate to a solvent capable of removing portions of the imaged layer(s) defining the pattern.

30. A printing plate comprising a) a substrate and b) a radiation-absorptive layer, wherein the radiation-absorptive layer comprises at least one modified pigment product comprising a pigment having attached at least one organic group represented by the formula —X-Sp-Alk, wherein X, which is directly attached to the pigment, represents an arylene heteroarylene, or alkylene group, Sp represents a spacer group, and Alk represents an alkenyl or alkyl group containing 50–200 carbon atoms, and wherein Sp is a succinimidyl group having the formula:

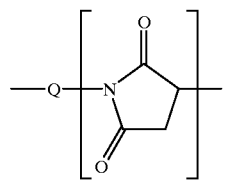

wherein Q represents a bond or a —SO$_2$C$_2$H$_4$(NR' Alkylene)$_p$-group, wherein the group Alkylene is a linear or branched C$_1$–C$_{12}$ alkylene group, R' is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

31. The printing plate of claim 30, wherein Q is a —SO$_2$C$_2$H$_4$(NR'C$_2$H$_4$)$_p$-group, R' is independently hydrogen or a (C$_2$H$_4$NH)$_p$H group, and p is an integer from 1–10.

32. The printing plate of claim 30, wherein Q is a bond.

33. A printing plate of claim 21, comprising a) a substrate and b) a radiation-absorptive layer, wherein the radiation-absorptive layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

34. A flexographic printing plate comprising: a) a substrate, b) a UV curable layer, and c) a radiation-absorptive layer, wherein the radiation-absorptive layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

35. The flexographic printing plate of claim 34, wherein the radiation-absorptive layer further comprises a polymer.

36. A thermal transfer recording material comprising: a) an ink layer, b) a photothermal layer, and c) a support, wherein the photothermal layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

37. The thermal transfer recording material of claim 36, wherein the photothermal layer further comprises a polymer.

38. A proofing material comprising: a) a radiation transparent support, b) a radiation curable layer, and c) a receiving layer, wherein the radiation curable layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

39. The proofing material claim 38, wherein the radiation curable layer further comprises a polymer.

40. A black matrix formed by applying a photosensitive coating on a clear substrate, exposing the coating imagewise, and developing and drying the coating, wherein the photosensitive coating comprises a solvent and at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 50 60–200 carbon atoms.

41. The black matrix of claim 40, further comprising a photosensitive resin.

42. An electrophoretic display comprising an arrangement of microcapsules, wherein the microcapsules comprise a dielectric fluid and at least one modified pigment product comprising a pigment having attached at least one organic group comprising a group represented by the formula —X-Sp-Alk, wherein X, which is directly attached to the pigment, represents an arylene, heteroarylene group, or alkylene group, Sp represents a spacer group, and Alk represents a polymer or oligomer of isobutene, butene, or propene containing 60–200 carbon atoms.

43. The electrophoretic display of claim 42, wherein Alk represents a polymer of butene.

44. The electrophoretic display of claim 42, wherein Alk represents a polymer or oligomer of isobutene, butene, or propene and maleic anhydride or derivatives thereof.

45. The An electrophoretic display comprising an arrangement of microcapsules, wherein the microcapsules comprise a dielectric fluid and at least one modified pigment product comprising a pigment having attached at least one organic group comprising a group represented by the formula —X-Sp-Alk, wherein X, which is directly attached to the pigment, represents an arylene, heteroarylene group, or alkylene group, Sp represents a spacer group, and Alk represents an alkenyl or alkyl group containing 50–200 carbon atoms, and wherein Sp is a succinimidyl group having the formula:

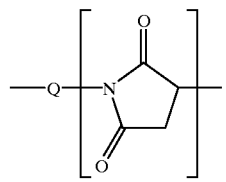

wherein Q represents a bond or a —SO$_2$C$_2$H4(NR' Alkylene)$_p$-group, wherein the group Alkylene is a linear or branched C$_1$–C$_{12}$ alkylene group, R'is independently hydrogen, a C$_1$–C$_6$alkyl group, or an (AlkyleneNR)$_p$R group, and p is an integer from 0–10, and R, which can be the same or different, represents hydrogen or a substituted or unsubstituted aryl or alkyl group.

46. The electrophoretic display of claim 45, wherein Q is a —SO$_2$C$_2$H$_4$(NR'C$_2$H$_4$)$_p$-group, R' is independently hydrogen or a (C$_2$H$_4$NH)$_p$H group, and p is an integer from 1–10.

47. The electrophoretic display of claim 45, wherein Q is a bond.

48. An electrophoretic display comprising an arrangement of microcapsules, wherein the microcapsules comprise a dielectric fluid and at least one modified pigment product comprising a pigment having attached at least one organic group comprising a group represented by the formula —X-Sp-Alk, wherein X which is directly attached to the pigment, represents an arylene, heteroarylene group, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

49. A non-aqueous inkjet ink composition comprising a non-aqueous vehicle and a modified pigment product comprising a pigment having attached at least one organic group comprising a group represented by the formula —X-Sp-Alk, wherein X, which is directly attached to the pigment, represents an arylene, heteroarylene, or alkylene group, Sp represents a spacer group, and Alk represents a polymer or oligomer of isobutene, butene, or propene containing 60–200 carbon atoms.

50. The inkjet ink composition of claim 49, wherein the non-aqueous vehicle is a liquid vehicle.

51. The inkjet ink composition of claim 49, wherein the non-aqueous vehicle is a solid vehicle.

52. A flexographic printing plate comprising: a) a substrate, b) a UV curable layer, and c) a radiation-absorptive layer, wherein the radiation-absorptive layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

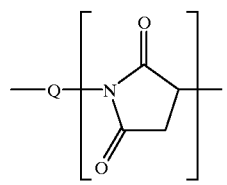

wherein Q represents a bond or a —SO$_2$C$_2$H$_6$(NR'Alkylene)$_p$-group, wherein the group Alkylene is a linear or branched C$_1$–C$_{12}$ alkylene group, R'is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

53. A flexographic printing plate comprising: a) a substrate, b) a UV curable layer, and c) a radiation-absorptive layer, wherein the radiation-absorptive layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

54. A thermal transfer recording material comprising: a) an ink layer, b) a photothermal layer, and c) a support, wherein the photothermal layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

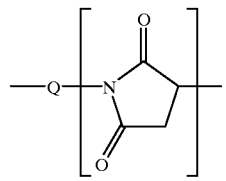

wherein Q represents a bond or a —SO$_2$C$_2$H$_6$(NR' Alkylene)$_p$-group, wherein the group Alkylene is a linear or branched C$_1$–C$_{12}$ alkylene group, R is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

55. A thermal transfer recording material comprising: a) an ink layer, b) a photothermal layer, and c) a support, wherein the photothermal layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

56. A proofing material comprising: a) a radiation transparent support, b) a radiation curable layer, and c) a receiving layer, wherein the radiation curable layer comprises at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

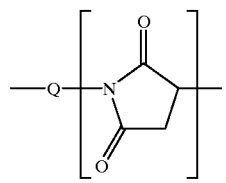

wherein Q represents a bond or a —SO$_2$C$_2$H$_6$(NR' Alkylene)$_p$-group, wherein the group Alkylene is a linear or branched C$_1$–C$_{12}$ alkylene group, R' is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

57. A proofing material comprising: a) a radiation transparent support, b) a radiation curable layer, and c) a receiving layer, wherein the radiation curable layer comprises at least one modified pigment product comprising a pigment having attached at least; one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50—200 carbon atoms, and wherein the organic group represented by the formula —X-Sp-Alk is a polyisobutenylsuccinimidylphenyl.

58. A black matrix formed by applying a photosensitive coating on a clear substrate, exposing the coating imagewise, and developing and drying the coating, wherein the photosensitive coating comprises a solvent and at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

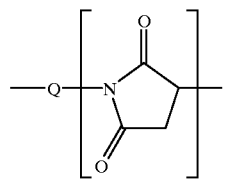

wherein Q represents a bond or a —SO$_2$C$_2$H$_6$(NR' Alkylene)$_p$-group, wherein the group Alkylene is a linear or branched C$_1$–C$_{12}$ alkylene group, R is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

59. A black matrix formed by applying a photosensitive coating on a clear substrate, exposing the coating imagewise, and developing and drying the coating, wherein the photosensitive coating comprises a solvent and at least one modified pigment product comprising a pigment having attached at least one organic group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

60. A non-aqueous inkjet ink composition comprising a non-aqueous vehicle and a modified pigment product comprising a pigment having attached at least one organic group comprising a group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein Sp is a succinimidyl group having the formula:

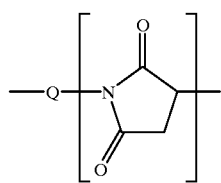

wherein Q represents a bond or a —SO$_2$C$_2$H$_6$(NR' Alkylene)$_p$-group, wherein the group Alkylene is a linear or branched C$_1$–C$_{12}$ alkylene group, R' is independently hydrogen, a C$_1$–C$_6$ alkyl group, or an (AlkyleneNR)$_p$R group, and p is an integer from 0–10, and R, which can be the same or different, represents hydrogen or a substituted or unsubstituted aryl or alkyl group.

61. A non-aqueous inkjet ink composition comprising a non-aqueous vehicle and a modified pigment product comprising a pigment having attached at least one organic group comprising a group represented by the formula —X-Sp-Alk, wherein X, which is directly attached to the pigment, represents an arylene, heteroarylene, or alkylene group, Sp represents a spacer group, and Alk represents an alkenyl or alkyl group containing 50–200 carbon atoms, and wherein the organic group represented by the formula —X-Sp-Alk is a polyisobutenylsuccinimidylphenyl.

* * * * *